United States Patent [19]
Yuasa et al.

[11] Patent Number: 5,252,975
[45] Date of Patent: Oct. 12, 1993

[54] DIGITAL-TO-ANALOG CONVERTER HAVING RESISTOR NETWORKS

[75] Inventors: Tachio Yuasa; Osamu Kobayashi; Kunihiko Gotoh, all of Kawasaki, Japan

[73] Assignee: Fujitsu Limited, Kanagawa, Japan

[21] Appl. No.: 899,963

[22] Filed: Jun. 17, 1992

[30] Foreign Application Priority Data

Jun. 18, 1991 [JP] Japan ................................. 3-145105

[51] Int. Cl.$^5$ ........................................................ H03M 1/68
[52] U.S. Cl. .................................... 341/145; 341/154
[58] Field of Search ............... 341/144, 145, 148, 153, 341/154

[56] References Cited

U.S. PATENT DOCUMENTS

| | | | |
|---|---|---|---|
| 3,997,892 | 12/1976 | Susset | 341/148 |
| 4,638,303 | 1/1987 | Masuda et al. | 341/154 |
| 4,918,448 | 4/1990 | Hauviller et al. | 341/145 |
| 5,059,978 | 10/1991 | Valdenaire | 341/145 |
| 5,079,552 | 1/1992 | Pelgrom et al. | 341/148 |
| 5,126,740 | 6/1992 | Kawada | 341/144 |
| 5,175,548 | 12/1992 | Kawada | 341/144 |

Primary Examiner—Howard L. Williams
Attorney, Agent, or Firm—Nikaido, Marmelstein, Murray & Oram

[57] ABSTRACT

A D/A converter includes a first resistor network including K resistors each having a resistance, where K is an integer, and a second resistor network including L resistors connected in series where L is an integer. The sum of resistances of the L resistors is approximately equal to the resistance of each of the K resistors. The D/A converter further includes a first switching part, coupled to the K resistors, for selecting (K−1) resistors among the K resistors in accordance with a digital input signal and for forming a series circuit including the (K−1) resistors and the second resistor network connected in series, first and second voltages being applied to respective ends of the series circuit. Furthermore, the D/A converter includes a second switching part, coupled to the second series circuit, for connecting one of the L resistors to an output terminal of the D/A converter.

16 Claims, 10 Drawing Sheets

FIG.1

SWITCH CONTROL SIGNALS

DIGITAL INPUT

DIGITAL-TO-ANALOG CONVERTER HAVING RESISTOR NETWORKS

BACKGROUND OF THE INVENTION

1. Field of the Invention

The present invention generally relates to digital-to-analog converters, and more particularly to a digital-to-analog converter having resistor networks and switches. More specifically, the present invention is concerned with a digital-to-analog converter having the following input-output conversion characteristic, $$Vout = Vin \cdot X/2^n$$

where Vin denotes an input voltage, X denotes a digital input signal, n denotes the number of bits of the digital input signal X, and Vout is an analog output voltage.

2. Description of the Related Art

Digital-to-analog converters (hereinafter simply referred to as D/A converters) are widely used in various electronic circuits, such as output circuits of digital systems. In general, it is required that D/A converters operate at high speeds and precisely convert digital input signals into analog output signals.

Figure 1:
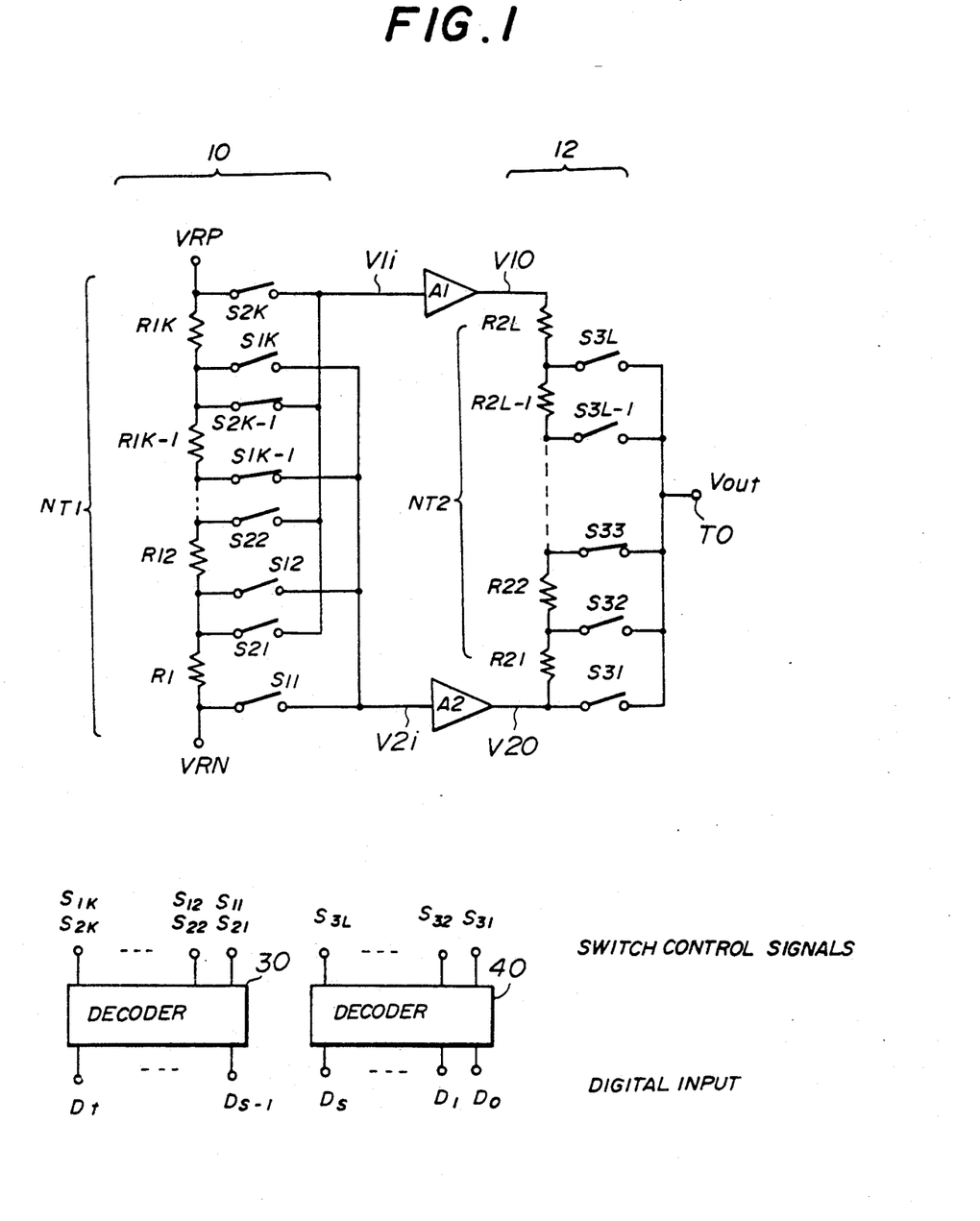
FIG. 1 is a circuit diagram of a related D/A converter.

FIG. 1 illustrates a D/A converter having two resistor networks. As shown, the D/A converter comprises a high-order-bit-side circuit 10 and a low-order-bit-side circuit 12, which respectively operate in response to high-order bits of a digital input signal and low-order bits thereof. The circuit 10 comprises a first resistor network NT1 composed of resistors R11–R1K connected in series, and switches S11–S1K and S21–S2K respectively connected to first and second ends of the resistors R11–R1K. The circuit 12 comprises a second resistor NT2 network composed of resistors R21–R2L connected in series, and switches S31–S3L respectively connected to ends of the resistors R21–R2L and an output terminal TO. The resistors R11–R1K have identical resistance values, and the resistors R21–R2L have identical resistance values. The circuit 10 is coupled to the circuit 12 via unit-gain buffer amplifiers A1 and A2. $V_{RP}$ denotes a positive reference voltage input, $V_{RN}$ denotes a negative reference voltage input, $V_{1i}$ and $V_{1o}$ denote input and output voltages of the buffer amplifier A1, $V_{2i}$ and $V_{2o}$ denote input and output voltages of the buffer amplifier A2, and Vout denotes an analog output voltage of the D/A converter.

The high-order-bit-side circuit 10 generates a high-order-bit-side output signal from an analog input voltage Vin ($=V_{RP}-V_{RN}$). More specifically, one switch S1Y among the switches S11–S1K and one switch S2Y among the switches S21–S2K are turned ON in response to high-order bits of a digital input signal. More specifically, the switches S11–S1K and S21–S2K are controlled by switch control signals obtained by decoding high-order bits Dt–Ds+1 of the analog input signal by means of a decoder 30.

In FIG. 1, the switches S1K−1 and S2K−1 are ON, and the other switches are OFF. Output voltages $V_{1i}$ and $V_{2i}$ of the circuit 10 are written as follows:

$$V_{1i} = (V_{RP} - V_{RN}) \cdot Y/K + V_{RN}$$

$$V_{2i} = (V_{RP} - V_{RN}) \cdot (Y-1)/K + V_{RN}$$

where $Y \leq K$, and Y is a natural number. The output voltages $V_{1i}$ and $V_{2i}$ of the circuit 10 are applied to the buffer amplifiers A1 and A2, which respectively output the output voltages $V_{1o}$ and $V_{2o}$ to the low-order-bit-side circuit 12.

One of the switches S31–S3L is selected in response to low-order bits of the digital input signal. More specifically, the switches S31–S3L are controlled by switch control signals obtained by decoding low-order bits Ds–D0 of the digital input signal by means of a decoder 40. In FIG. 1, switch S33 is ON, and the other switches are OFF. The analog output voltage Vout obtained at the output terminal TO is written as follows:

$$Vout = (V_{1o} - V_{2o}) \cdot (Z-1)/L + V_{2o}$$

where $X \leq L$, and Z is a natural number and indicates a selected resistor.

The buffer amplifiers A1 and A2 are unit amplifiers, and thus $$V_{1o} = V_{1i}, \quad V_{2o} = V_{2i}.$$

By substituting this relationships into the above equation, the analog output voltage Vout is expressed as follows:

$$\begin{aligned}
Vout &= (V_{1i} - R_{2i}) \cdot (Z-1)/L + V_{2i} \\
&= (V_{RP} - V_{RN}) \cdot (Y - Y + 1)/K \cdot (Z-1)/L + \\
&\quad (V_{RP} - V_{RN}) \cdot (Y-1)/K + V_{RN} \\
&= (V_{RP} - V_{RN}) \cdot 1/K \cdot (Z-1)/L + \\
&\quad (V_{RP} - V_{RN}) \cdot 1/K \cdot (Y-1) + V_{RN} \\
&= (V_{RP} - V_{RN}) \cdot 1/K \cdot \{Y - 1 + (Z-1)/L\} + \\
&\quad V_{RN}.
\end{aligned}$$

When X is written as $(Y-1) \cdot L + Z - 1$, $K \cdot L = 2^n$, and thus X is the digital input signal having a value defined by the following:

$$0 \leq X \leq 2^n.$$

As a result, the D/A converter shown in FIG. 1 functions as an n-bit D/A converter which converts the digital input signal X into the analog output voltage Vout in the following manner:

$$Vout = (V_{RP} - V_{RN}) \cdot X/2^n + V_{RN}.$$

However, the D/A converter shown in FIG. 1 has the following disadvantages. It is necessary to use the buffer amplifiers A1 and A2 in order to connect the circuits 10 and 12 to each other because the output impedance of the circuit 10 does not match the input impedance of the circuit 12.

Figure 2A:
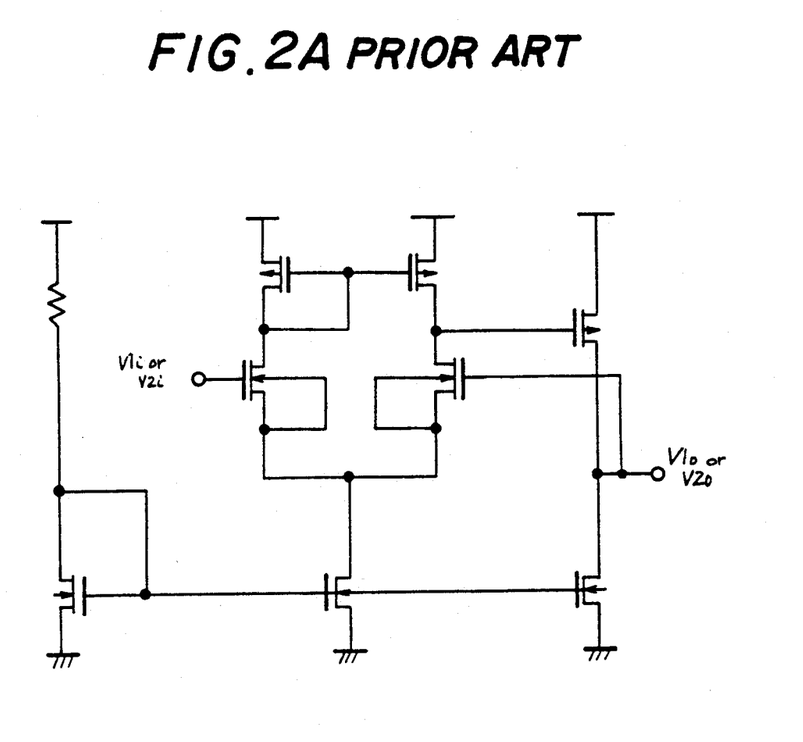
FIG. 2A and 2B are diagrams showing a buffer amplifier use in the D/A converter shown in FIG. 1.
Figure 2B:
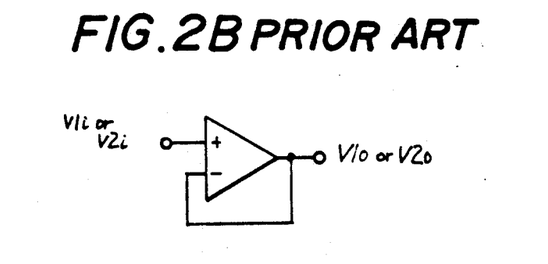

As shown in FIG. 2A, the unit-gain buffer amplifier can be formed with an operational amplifier. The operational amplifier shown in FIG. 2A comprises seven field effect transistors. The operational circuit shown in FIG. 2A has a symbol shown in FIG. 2B.

The buffer amplifiers necessarily have offset voltages. In other words, buffer amplifiers having no offset voltages are not available. Hence, the output voltages $V_{1o}$ and $V_{2o}$ of the buffer amplifiers A1 and A2 have offset voltages $\Delta_1$ and $\Delta_2$ as follows:

$$V_{1o} = V_{1i} + \Delta_1,$$

$$V_{2o} = V_{2i} + \Delta_2.$$

In this case, the analog output voltage Vout is written as follows:

$$\begin{aligned}
V_{out} &= (V_{1o} - V_{2o}) \cdot (Z - 1)/L + V_{2o} \\
&= (V_{RP} - V_{RN}) \cdot 1/K \cdot (Z - 1)/L + \\
&\quad (\Delta_1 - \Delta_2) \cdot (Z - 1) \cdot (Z - 1)/L + \\
&\quad (V_{RP} - V_{RN}) \cdot (Y - 1)/K + V_{RN} + \Delta_2 \\
&= (V_{RP} - V_{RN}) \cdot 1/KL \cdot \{(Y - 1)L + Z - 1\} + \\
&\quad V_{RN} + (\Delta_1 - \Delta_2) \cdot (Z - 1)/Z + \Delta_2 \\
&= (V_{RP} - V_{RN}) \cdot X/2^n + V_{RN} + \\
&\quad (\Delta_1 - \Delta_2) \cdot (Z - 1) \cdot /L + \Delta_2.
\end{aligned}$$

When $V_{RN}=0$ for the sake of simplicity, the analog output voltage Vout is expressed as follows:

$$V_{out} = V_{RP} X/2^n + (\Delta_1 - \Delta_2)\cdot(Z-1)/L + \Delta_2.$$

For example, when $Y=1$ and $Z=L$, that is, $X=(1-1)\cdot L+L-1=L-1$, the output voltage Vout(I) is expressed as follows:

$$\begin{aligned}
V_{out}(I) &= V_{RP} \cdot (L - 1)/2^n + (\Delta_1 - \Delta_2) \cdot (L - 1)/L + \Delta_2 \\
&= V_{RP} \cdot (L - 1)/KL + \Delta_1(L - 1)/L + \Delta_2 \cdot 1/L.
\end{aligned}$$

When $Y=2$ and $Z=1$, that is, $X=(2-1)\cdot L+1-1=L$, the output voltage Vout(II) is expressed as follows:

$$\begin{aligned}
V_{out}(II) &= V_{RP} \cdot L/2^n + (\Delta_1 - \Delta_2) \cdot (1 - 1)/L + \Delta_2 \\
&= V_{RP} \cdot L/KL + \Delta_2.
\end{aligned}$$

The difference Vdiff between the above-mentioned output voltages Vout(I) and Vout(II) is written as follows:

$$\begin{aligned}
V_{diff} &= V_{out}(II) - V_{out}(I) \\
&= V_{RP}\cdot 1/KL - (\Delta_1 - \Delta_2)\cdot (L - 1)/L \\
&= 1/L\{V_{RP}\cdot 1/K - (\Delta_1 - \Delta_2)\cdot (L - 1)\}.
\end{aligned}$$

It will now be assumed that a power supply voltage is equal to 5 V, the digital input signal X is an eight-bit signal, and the offset voltages of the buffer amplifiers A1 and A2 are equal to 15 mV and −15 mV, respectively. That is, $V=V_{RP}=5[V]$, $K=L=16$, $\Delta_1=15[mV]$, and $\Delta_2=-15[mV]$. By inserting these values into the equation regarding the voltage difference Vdiff, the following is obtained:

$$\begin{aligned}
V_{diff} &= 1/16 \cdot \{5/16 - (15 \times 10^{-3} + 15 \times 10^{-3}) \cdot 15\} \\
&\approx -8.59 \, [mV].
\end{aligned}$$

However, in the above case, the voltage difference Vdiff must be LLSB (Least Significant Bit) and be positive. This shows that the analog output voltage does not have linearity and that the buffer amplifiers 1A and 1B degrade the D/A conversion characteristics. Further, due to the frequency characteristics of the buffer amplifiers 1A and 1B, the D/A converter has a limited operation frequency, and hence a limited operation speed.

SUMMARY OF THE INVENTION

It is a general object of the present invention to provide a D/A converter in which the above disadvantages are eliminated.

A more specific object of the present invention is to provide a D/A converter which does not employ buffer amplifiers which cause the abovementioned problems. That is, the D/A converter of the present invention does not have an error due to the offset voltages of the buffer amplifiers, and does not have any limited operation frequency based on the frequency characteristics of buffer amplifiers.

The above objects of the present invention are achieved by a D/A converter that includes a first resistor network including K resistors each having a resistance approximately equal to each other, where K is an integer, and a second resistor network including L resistors connected in series where L is an integer. The sum of resistances of the L resistors is approximately equal to the resistance of each of the K resistors. The D/A converter further includes a first switching part, coupled to the K resistors, for selecting (K−1) resistors among the K resistors in accordance with a digital input signal and for forming a series circuit including the (K−1) resistors and the second resistor network connected in series, first and second voltages being applied to respective ends of the second series circuit. Furthermore, the D/A converter includes a second switching part, coupled to the second series circuit, for connecting one of the L resistors to an output terminal of the D/A converter.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 3:
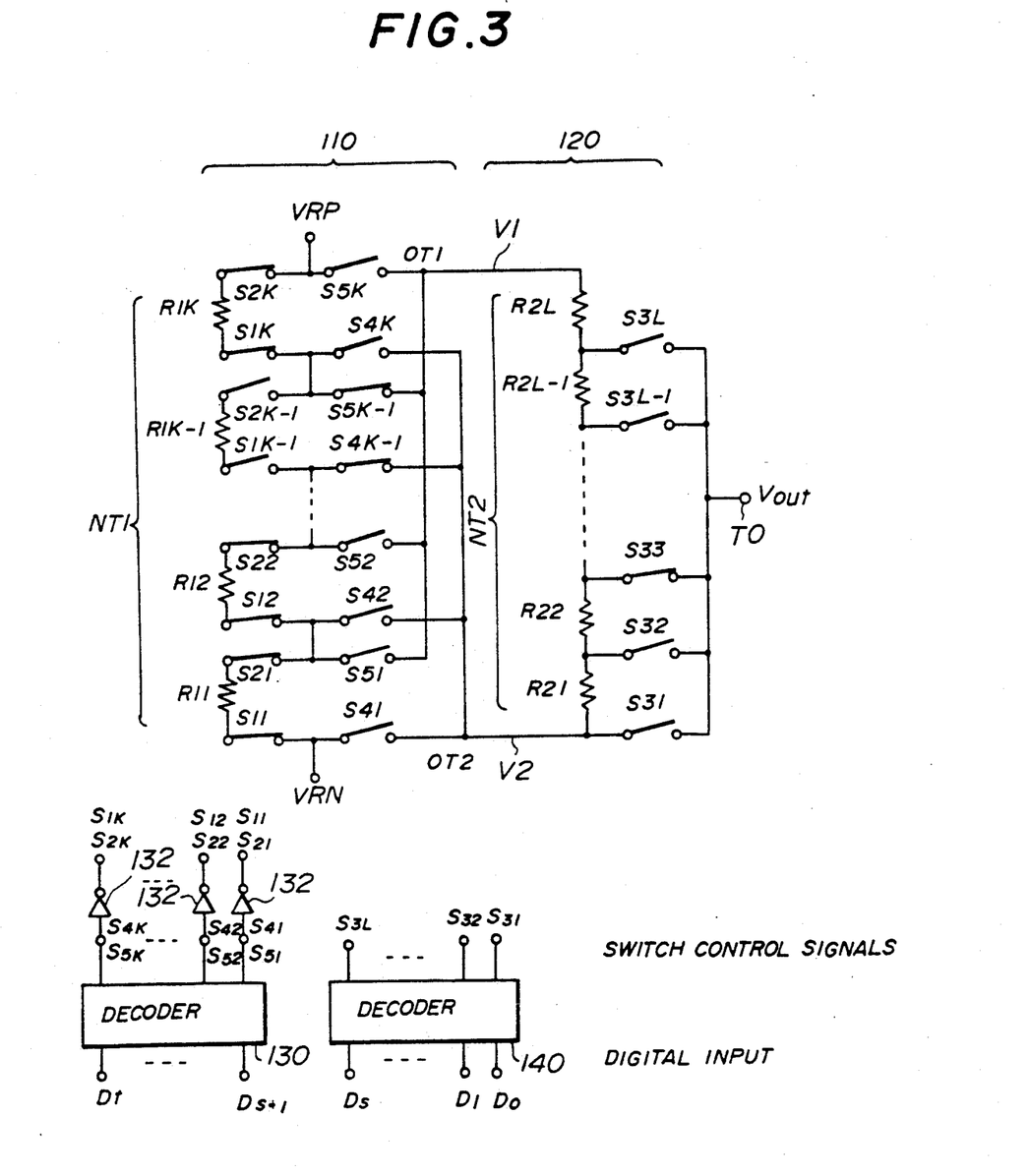
FIG. 3 is a circuit diagram of a D/A converter according to a first embodiment of the present invention.

FIG. 3 shows a D/A converter according to a first embodiment of the present invention. In FIG. 3, parts which are the same as those shown in FIG. 1 are given the same reference numerals as in FIG. 1. The D/A converter shown in FIG. 3 comprises a high-order-bit-side circuit 110, and a low-order-bit-side circuit 120. The circuit 110 comprises the aforementioned resistor network NT1 composed of resistors R11–R1K, a first group of pairs of switches S11–S1K and S21–S2K, and a second group of pairs of switches S41–S4K and S51–S5K. The resistors R11–R1K all have identical resistance values. The pairs of switches S11–S1K and S21–S2K are respectively connected to first and second ends of the resistors R11–R1K. For example, a pair of switches S1K and S2K are respectively connected to first and second ends of the resistor R1K. One end of the switch S2i (i=1, 2, ..., K−1) is connected to one end of the switch S1i+1.

The switches S41-S4K and S51-S5K connected to the switches S11-S1K and S21-S2K, respectively. Further, the switches S51-5K are connected to a first output terminal OT1 of the circuit 110, and the switches S41-S4K are connected to a second output terminal OT2 thereof. The voltage $V_{RP}$ is applied to a node where the switches S2K and S5K are Y connected in series. The voltage $V_{RN}$ is applied to a node where the switches S11 and S41 are connected in series. One end of the switch S5i (i 1, 2, ..., K−1) is connected to one end of the switch S4i+1.

The low-order-bit-side circuit 120 shown in FIG. 3 is the same as the low-order-bit-side circuit 20 shown in FIG. 1. That is, the circuit 120 comprises the aforementioned resistor network NT2 and the switches S31-S3L. The two input terminals of the circuit 120 are directly connected to the respective output terminals of the circuit 110. The resistors R21-R2L have identical resistance values and are connected in series. The switches S31-S3L are respectively provided for the resistors R21-R2L.

The D/A converter shown in FIG. 3 comprises decoders 130 and 140. The decoder 130 receives high-order bits Dt-Ds+1 of a digital input signal, and generates K decoded signals (switch control signals), which are applied to the switches S5K-S51 and S4K-S41. One of the K switch control signals has a level which turns ON one of the switches S51-S5K and one of the switches S41-S4K. As shown in FIG. 3, K inverters 132 are connected to the decoder 130. The inverters 132 generate inverted versions of the respective switch control signals from the decoder 130. The output signals of the inverters 132 are applied to the switches S2K-S21 and S1K-S11, and turn ON (K−1) switches among the switches S2K-S21 and (K−1) switches among the switches S1K-S11.

The decoder 140 receives low-order bits of the digital input signal, and generates L decoded signals (switch control signals), which are applied to the switches S3L-S31. The L switch control signals generated by the decoder 140 turn ON one of the L switches S31-S3L. It is possible however to use a single decoder having the functions of the decoders 130 and 140. The digital input signal is decoded as follows.

| Digital input | | | Decoded signals | | |
|---|---|---|---|---|---|
| Dt, | ..., | D1, | D0 | Sy, | ..., | S1, | S0 |
| 1, | ..., | 1, | 1 | 1, | ..., | 0, | 0 |
| . | | . | | . | | | |
| . | | . | | . | | | |
| . | | . | | . | | | |
| 0, | ..., | 0, | 1 | 0, | ..., | 0, | 1 |
| 0, | ..., | 0, | 0 | 0, | ..., | 0, | 0 |

One of the resistors R11-R1K is selected by the decoder 130. In FIG. 3, the resistor R1K−1 is selected in the state in which the switches S1K-1 and S2K−1 are turned OFF and the switches S4K−1 and S5K−1 are turned ON. Hence, a current passes through the resistor R1K, the terminal OT1, resistors R2L-R21, terminal OT2, and resistors R1K−2-R11.

It should be noted that the resistor R1K−1 is replaced with a series circuit including the resistors R21-R2L. In other words, the resistor R1K−1 is equivalent to the series circuit including the resistors R21-R2L. That is, the resistor R1K−1 has a resistance value equal to the sum of the resistance values of the resistors R21-R2L. Of course, each of the other resistors R11-R1K−1 and R1K has resistance values identical to the sum of the resistance values of the resistors R21-R2L. That is, each of the resistors R11-R1K has a resistance value L times that of each of the resistors R21-R2L.

The switches S11-S1K, S21-2K, S31-S3L, S41-S4K, and S51-S5K respectively have internal resistances. It is necessary for each of the resistors R31-R3L to have a resistance value much greater than the above internal resistance values so that the internal resistance values are negligible.

On the low-order-bit side circuit 120, one of the switches S31-S3L is turned ON in response to the switch control signals generated by the decoder 140. Hence, the output voltage Vout of the D/A converter is defined. There is a relationship in which $K \cdot L = 2^n$, where n is a natural number and indicates the number of bits processed by the D/A converter.

When one of the resistors R11-R1K is selected, the output voltage V1 obtained at the first output terminal OT1 of the circuit 110, and the output voltage V2 obtained at the second output terminal OT2 thereof are described as follows:

$$V1 = (V_{RP} - V_{RN}) \cdot Y/K + V_{RN}$$

$$V2 = (V_{RP} - V_{RN}) \cdot (Y-1)/K + V_{RN}$$

where $Y \leq K$, and Y is a natural number. Out of the 2K switches S1# and S2# (# is a natural number), only switches S1Y and S2Y are turned OFF (open), and the other switches are turned ON (closed). Hence, one resistor R1Y of the high-order-bit-side circuit 110 is replaced with the series circuit of the resistors R21-R2L. As a result, a series circuit including the resistors R11-R1Y−1, R21-R2L, and R1Y+1-R1K is formed.

One of the switches S31-S3L is turned ON, and the other switches are turned OFF. Hence, the voltage developed across the series circuit including the resistors R21-R2L is divided. That is, the analog output signal Vout is described as follows:

$$Vout = (V1 - V2) \cdot (Z-1)/L + V2$$

where $Z \leq L$ and Z is a natural number. By inserting the above-mentioned voltages V1 and V2 into the above equation, the following is obtained:

$$\begin{aligned} Vout &= (V1 - V2) \cdot (Z - 1)/L + V2 \\ &= (V_{RP} - V_{RN}) \cdot (Y - Y + 1)/K \cdot (Z - 1)/L + \\ &\quad (V_{RP} - V_{RN}) \cdot (Y - 1)/K + V_{RN} \\ &= (V_{RP} - V_{RN}) \cdot 1/K \cdot (Z - 1)/L + \\ &\quad (V_{RP} - V_{RN}) \cdot 1/K \cdot (Y - 1) + V_{RN} \\ &= (V_{RP} - V_{RN}) \cdot 1/K \cdot \{Y - 1 + (Z - 1)/L\} + \\ &\quad V_{RN}. \end{aligned}$$

Assuming that the $X = (Y-1) \cdot L + Z - 1$, $K \cdot L = 2^n$, and hence the input digital signal X indicates a value meeting $0 \leq X \leq 2^n$. As a result, the D/A converter shown in FIG. 3 functions as an n-bit D/A converter which generates the following analog output voltage Vout:

$$Vout = (V_{RP} - V_{RN}) \cdot X/2^n + V_{RN}.$$

It will be noted that the D/A converter shown in FIG. 3 does not need buffer amplifiers. Further, it can be seen from the above that the D/A converter has an excellent linearity in the D/A conversion characteristic.

Figure 4:
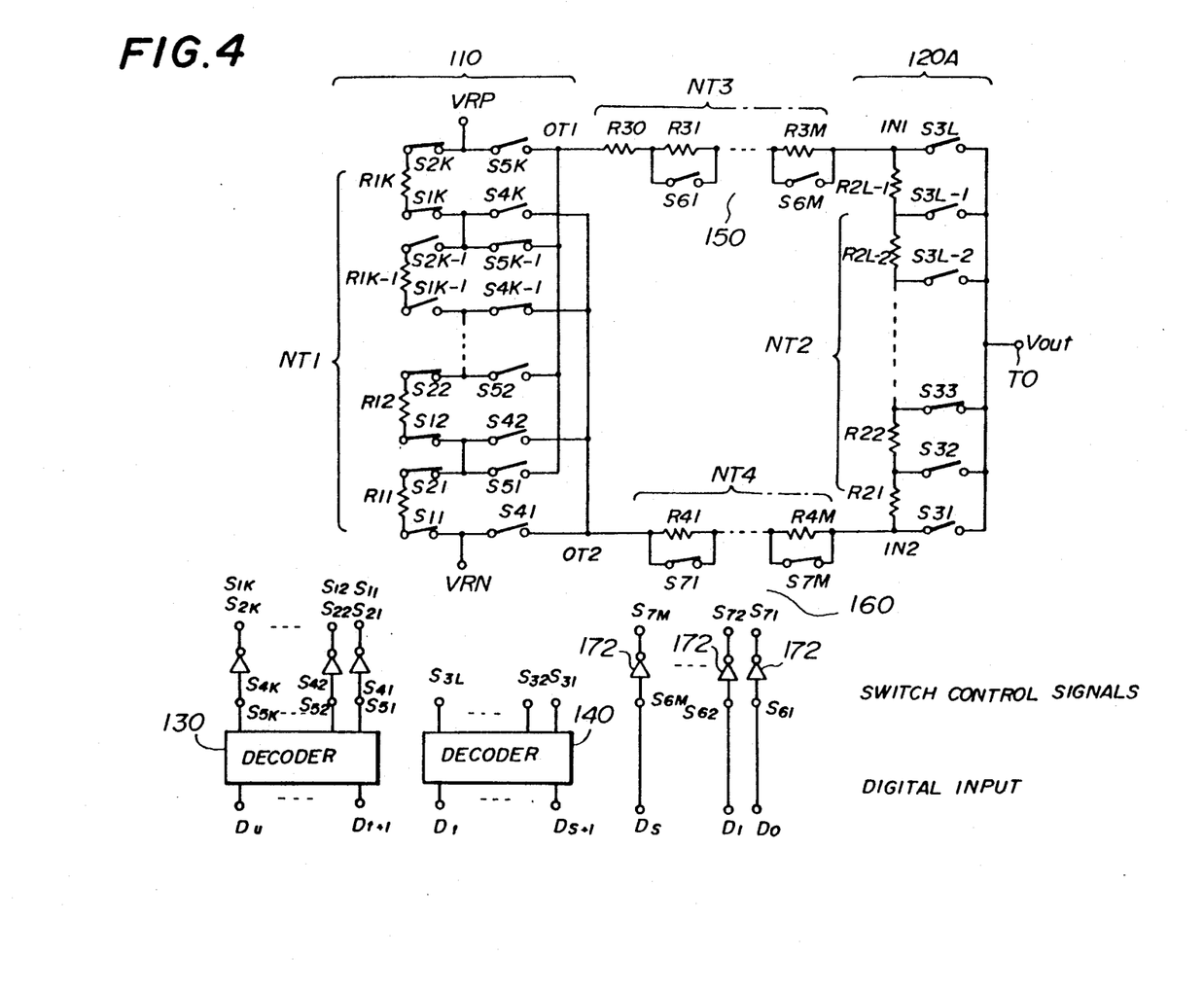
FIG. 4 is a circuit diagram of a D/A converter according to a second embodiment of the present invention.

A description will now be given, with reference to FIG. 4, of a D/A converter according to a second embodiment of the present invention. In FIG. 4, parts which are the same as those shown in the previously described figures are given the same reference numerals as in the previous figures. The D/A converter shown in FIG. 4 is obtained by omitting the resistor R2L from the D/A converter shown in FIG. 3, and providing a third circuit 150 between the output terminal of the first circuit 110 and a first input terminal IN1 of a middle-order-bit-side circuit 120A and a fourth circuit 160 between the output terminal OT2 of the first circuit and a second input terminal IN2 of the circuit 120A. The circuit 120A comprises (L−1) resistors R21-R2L−1, and L switches S31-S3L.

The third circuit 150 comprises a third resistor network NT3 consisting of (M+1) resistors R30-3M connected in series (M is a natural number), and a third group of M switches S61-S6M. As shown in FIG. 4, the switches S61-6M are respectively connected across the resistors R31-R3M. The fourth circuit 160 comprises a fourth resistor network NT4 consisting of M resistors R41-R4M connected in series, and a fourth group of M switches S71-S7M. As shown, the switches S71-S7M are respectively connected across the resistors R41-R4M.

The resistors R30-R3M have mutually different resistance values which generally vary from one to another stepwise. The resistor R30 has the smallest resistance value, and the resistor R3M has the largest resistance value. The resistors R41-R4M have the same resistance values as the resistors R31-R3M, respectively. For example, assuming that the resistor R30 has a resistance value of 1, the resistors R31, R32 and R34 respectively have resistance values of 1, 2 and 4. By selectively turning ON and OFF the switches S61-S6M, it is possible to provide a plurality of resistance values. Similarly, by selectively turning ON and OFF the switches S71-S7M, it is possible to provide a plurality of resistance values.

The numbers K, L and M have the following relationship:

$$K \cdot L \cdot M = 2^n$$

where n is the number of bits of the digital input signal, and is a natural number.

The first circuit 110 operates in response to high-order bits of the digital input signal. The decoder 130 shown in FIG. 4 generates switch control signals from high-order bits $D_u$-$D_{t+1}$ of the digital input signal. The second circuit 120 operates in response to middle-order bits of the digital input signal. The decoder 140 shown in FIG. 4 generates switch control signals from middle-order bits of the digital input signal. The third and fourth circuits 150 and 160 operate in response to low-order bits of the digital input signal other than the high-order and middle-order bits thereof. Low-order bits $D_0, D_1, \ldots, D_s$ (s=M) are directly applied to the switches S61, S62, ..., S6M, respectively. Inverters 172 are provided for generating inverted versions of the low-order bits $D_0, D_1, \ldots, D_s$. The inverted versions of the low-order bits $D_0, D_1, \ldots, D_s$ are applied to the switches S71, S72, ..., S7M.

In this manner, (M+1) resistors among the (2M+1) resistors of the third and fourth circuits 150 and 160 are always selected. The resistance values of the resistors R30-R3M and R41-R4M are selected so that the sum of the resistance values of the resistor R30 and the M selected resistors of the third and fourth circuits NT3 and NT4 is equal to the resistance value of the resistors R2L shown in FIG. 3.

The second embodiment of the present invention is capable of converting a digital input signal into an analog output signal more precisely than the first embodiment of the present invention. The resistance values of the resistors R30-R3M and R41-R4M are much smaller than those of the other resistors of the first and second circuits 110 and 120A. Hence, even if the resistors R30-R3M and R41-R4M have deviations from a target resistance value, these deviations of the resistor R30 and the M selected resistors are substantially canceled. Consequently, the precision of the D/A converting operation is little affected by the above deviations. In principle, it is possible to control the switches S31-S3L by the low-order bits of the digital input signal and to control the switches S61-S6M and S71-S7M by the middle-order bits thereof. However, in this case, an increased chip surface area necessary for forming all the resistors is needed.

Figure 5:
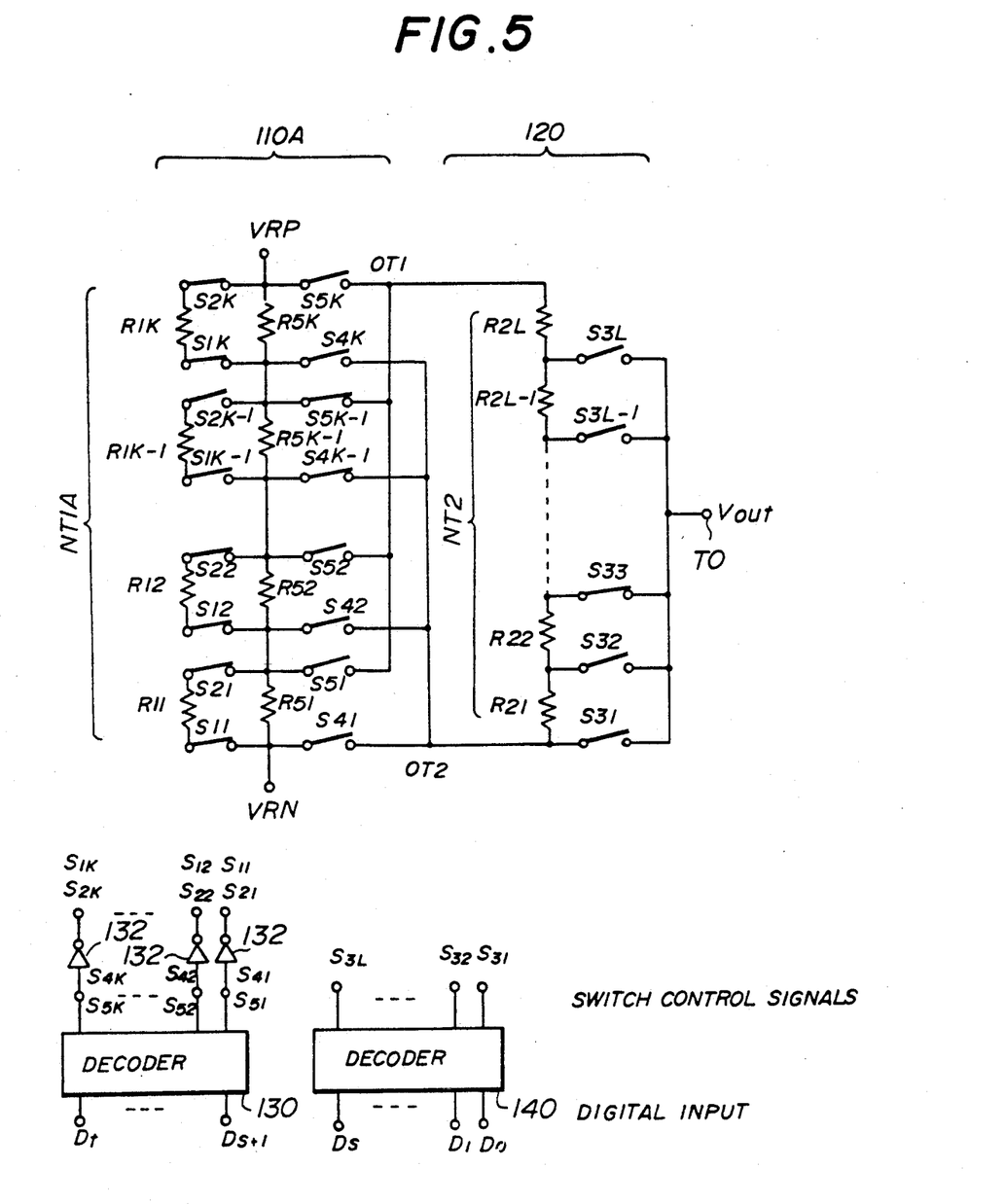
FIG. 5 is a circuit diagram of a D/A converter according to a third embodiment of the present invention.

A description will now be given, with reference to FIG. 5, of a D/A converter according to a third embodiment of the present invention. In FIG. 5, those parts which are the same as parts shown in the previously described figures are given the same reference numerals. The D/A converter shown in FIG. 5 comprises a high-order-bit-side circuit 110A, the aforementioned low-order-bit-side circuit 120, the aforementioned decoders 130 and 140, and the inverters 132. The circuit 110A comprises a resistor network NTLA composed of the resistors R11-R1K, and resistors R51-R5K. As shown in FIG. 5, the resistors R51-R5K are respectively connected across the resistors R11-R1K. As will be described in detail later, the resistors R51-R5K all have identical resistance values, which values are much smaller than those of the resistors R11-R1K and those of the resistors R21-R2L.

Use of the resistors R51-R5K provides the following advantages. In actuality, a plurality of parasitic capacitors are connected to nodes. For example, when some switches are turned ON and OFF or the D/A converter starts to operate, some parasitic capacitors are charged and some parasitic capacitors are discharged. It takes a certain amount of time to charge the parasitic capacitors. In the circuit configuration shown in FIG. 5, it is possible to rapidly charge the parasitic capacitors by means of a current passing through a series circuit of the resistors R51-R5K. On the other hand, in the circuit configuration shown in FIG. 3, it takes a longer time than in the circuit configuration shown in FIG. 5 to charge the parasitic capacitors, because these parasitic capacitors are charged by a current passing through the resistors R11-R1K except for the selected resistor and the resistors R21-R2L. In other words, the RC time constant of the entire circuit can be reduced by using the resistors R51-R5K.

Further, the D/A converter shown in FIG. 5 is capable of following changes in the voltages $V_{RP}$ and $V_{RN}$. In some applications of D/A converters, the difference between the voltages $V_{RP}$ and $V_{RN}$ is intentionally changed in accordance with information which is a parameter for changing the analog output signal of the D/A converter. When the voltage difference changes, the current passing through the D/A converter changes. As described above, the parasitic capacitors are rapidly charged and discharged, and hence the D/A converter shown in FIG. 5 is capable of following changes in the voltage difference. Of course, the state of the D/A converter shown in FIG. 5 will be rapidly stabilized if the voltage difference changes slightly due to a cause regarding a power supply system providing the voltages $V_{RP}$ and $V_{RN}$.

Furthermore, the resistors R51-R5K eliminate the influence of the ON resistances of the switches because the resistance values of the resistors R51-R5K are much smaller than those of the resistors R11-R1K, and most of current passes through the resistors R51-R5K.

A description will now be given of the response characteristics of the first and third embodiments of the present invention. First, an error contained in the analog output voltage Vout will be obtained taking into account the ON (internal) resistances of the switches.

The voltage drop developed across each of the switches S3# (# is a natural number) is determined by an output current passing through the resistors R31-R3L. Hence, it is enough to consider the voltages V1 and V2 of the nodes at which the first and second circuits 110 (110A) and 120 are connected to each other. It will now be assumed that the resistance of each of the resistors R11-R1K is denoted as R, and the ON resistances of the switches S1#, S2#, S4# and S5# are respectively denoted by r. In the circuit shown in FIG. 1, the following equation can be obtained:

$$R21+R22+\ldots+R2L=R.$$

The voltages V1X and V2X obtained when the resistor ($1 \leq X \leq K$) R1X which is one of the resistors R11-R1K, is replaced with the second resistor network NT2 composed of the resistors R21-R2L are expressed as follows:

$$V1X=(X/K)\cdot(V_{RP}-V_{RN})+V_{RN} \quad (1)$$

$$V2X=[\{X-(R+r)/(R+2r)\}/K](V_{RP}-V_{RN})+V_{RN} \quad (2)$$

A voltage error generated when the digital input signal component relating to the first resistor network NT1 increases by 1 is written as follows:

$$V2X-V1X-1=r/\{K(R+2r)\}\cdot(V_{RP}-V_{RN}) \quad (3).$$

In order to suppress the voltage error so that it is equal to or less than LSB/2, the following must be satisfied:

$$V2X-V1X-1 \leq LSB/2.$$

Hence, the following is obtained:

$$r/\{K(R+2r)\}\cdot(V_{RP}-V_{RN}) \leq (\tfrac{1}{2})\cdot(1/KL)\cdot(V_{RP}-V_{RN})$$
$$r/(R+2r) \leq L/2. \quad (4)$$

When L=16, the following is obtained:

$$R \geq 30r \quad (5).$$

Figure 6A:
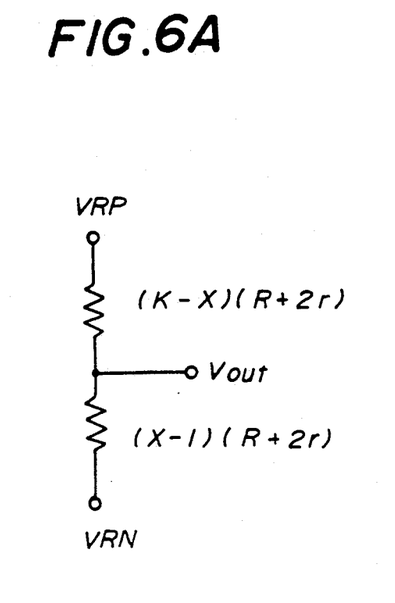
FIG. 6A is an equivalent circuit of the D/A converter shown in FIG. 3.

Next, the internal impedance of the circuit shown in FIG. 3 will be considered. Since the impedance of the resistor network NT1 is much smaller than that of the resistor network NT2, the equivalent circuit of the D/A converter shown in FIG. 3 is approximately illustrated as shown in FIG. 6A. The internal impedance viewed from the output terminal TO is minimized when X=K/2. Thus, the minimum internal impedance Z01 is written as follows:

$$Z01 \approx (K/4)\cdot(R+2r) \quad (6).$$

When R=30r so that the condition (5) is satisfied, the minimum internal impedance Z01 is obtained as follows:

$$Z01 \approx 8Kr \quad (7).$$

The response speed of the circuit shown in FIG. 3 depends on the time constant based on the resistance defined by the above (7) and an output capacitance.

Figure 6B:
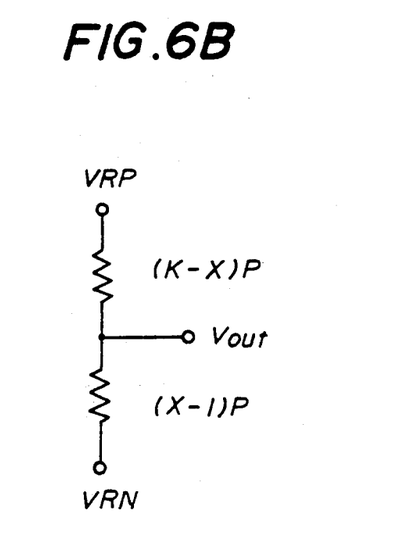
FIG. 6B is an equivalent circuit of the D/A converter shown in FIG. 5.

The internal impedance of the D/A converter shown in FIG. 5 will now be considered. The impedance of the second resistor network NT2 is negligible as in the case of the D/A converter shown in FIG. 3. Assuming that the resistance value of each resistor R5# is much smaller than that of each resistor R1#, the equivalent circuit of the D/A converter shown in FIG. 5 is approximately illustrated as shown in FIG. 6B. The internal impedance Z02 of the D/A converter shown in FIG. 5 viewed from the output terminal OUT is the largest when X=K/2. Thus, the following is obtained:

$$Z02 \approx (K/4)P \quad (8)$$

where P is the resistance of each resistor R5#. Even when the ON resistance r of each switch is approximately equal to the resistance of each resistor R5#, the internal impedance of the D/A converter shown in FIG. 5 is much smaller than that of the D/A converter shown in FIG. 3. This means that the response speed of the D/A converter shown in FIG. 5 is much greater than that of the D/A converter shown in FIG. 3.

Figure 7:
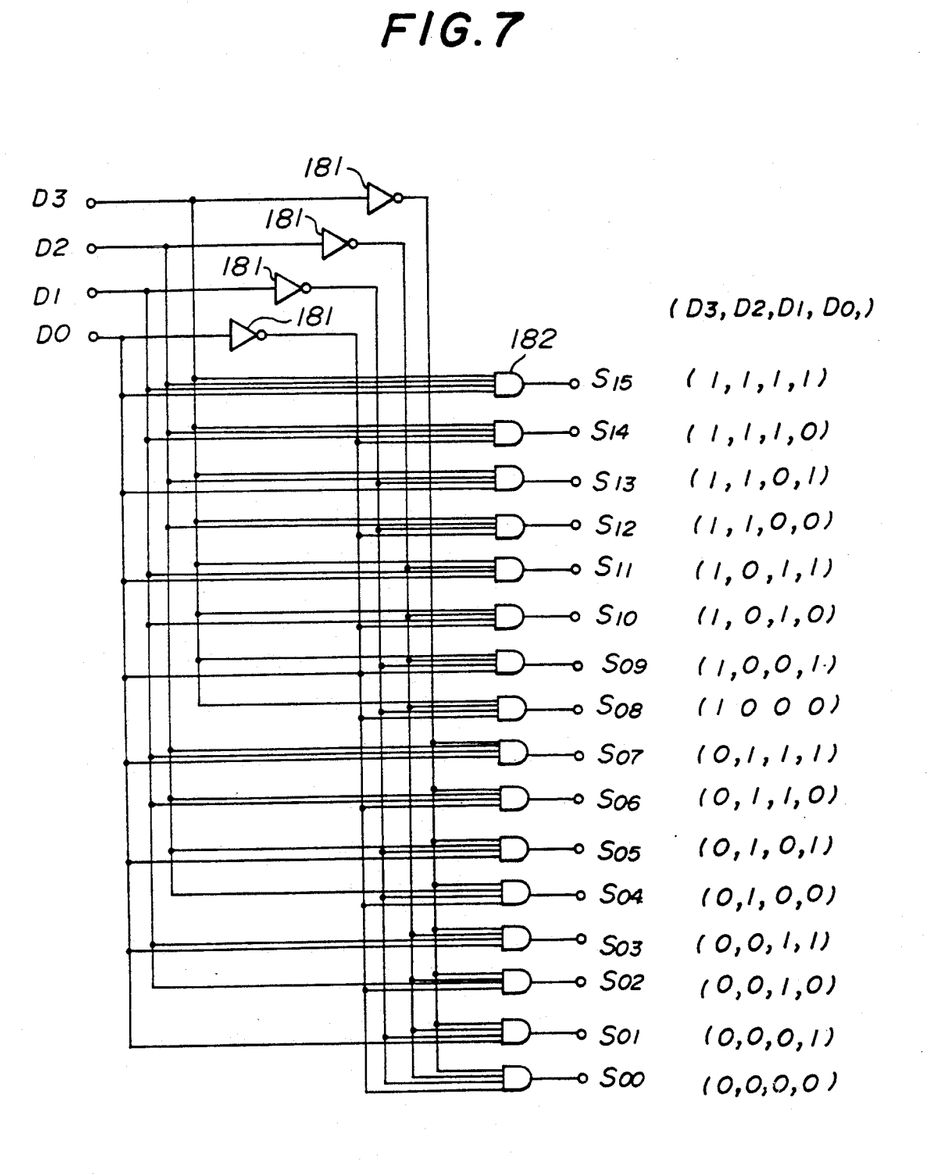
FIG. 7 is a circuit diagram of a decoder used in the embodiments of the present invention.

Each decoder used in the aforementioned embodiments of the present invention is configured as shown in FIG. 7. A decoder shown in FIG. 7 is a four-bit decoder, which receives four bits D0-D3, and generates decoded signals (switch control signals) S00-S15. The decoder shown in FIG. 7 comprises four inverters 181, and 16 four-input AND gates 182. The decoder shown in FIG. 7 outputs 16 ($=2^4$) combinations of the four bits D0-D3. It is also possible to use another decoder having the same function as mentioned above.

Figure 8:
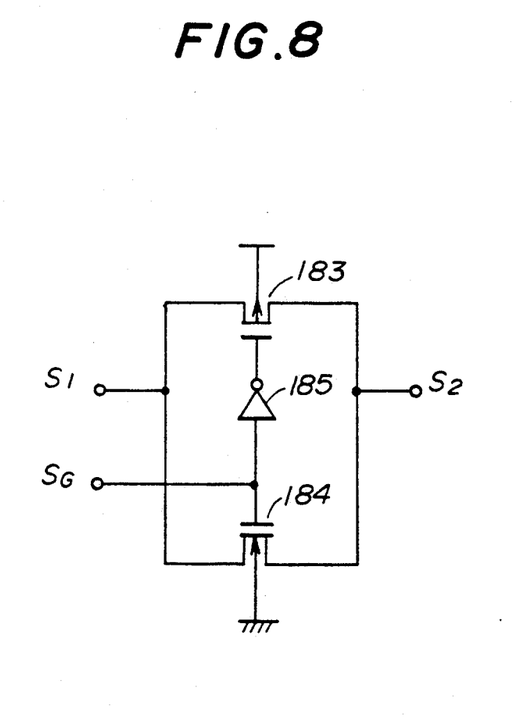
FIG. 8 is a circuit diagram of a switch used in the embodiments of the present invention.

Each switch used in the aforementioned embodiments of the present invention is configured as shown in FIG. 8. The switch shown in FIG. 8 is a transfer gate, which comprises transistors 183 and 184, and an inverter 185. The switch control signal, labeled $S_G$, is directly applied to the gate of the transistor 184, and applied to the gate of the transistor 183 via the inverter 185. When the switch control signal $S_G$ is maintained at a high level, an input terminal S1 and an output terminal S2 are connected to each other. When the switch control signal $S_G$ is maintained at a low level, the input terminal S1 and the output terminal S2 are electrically isolated from each other.

Figure 9:
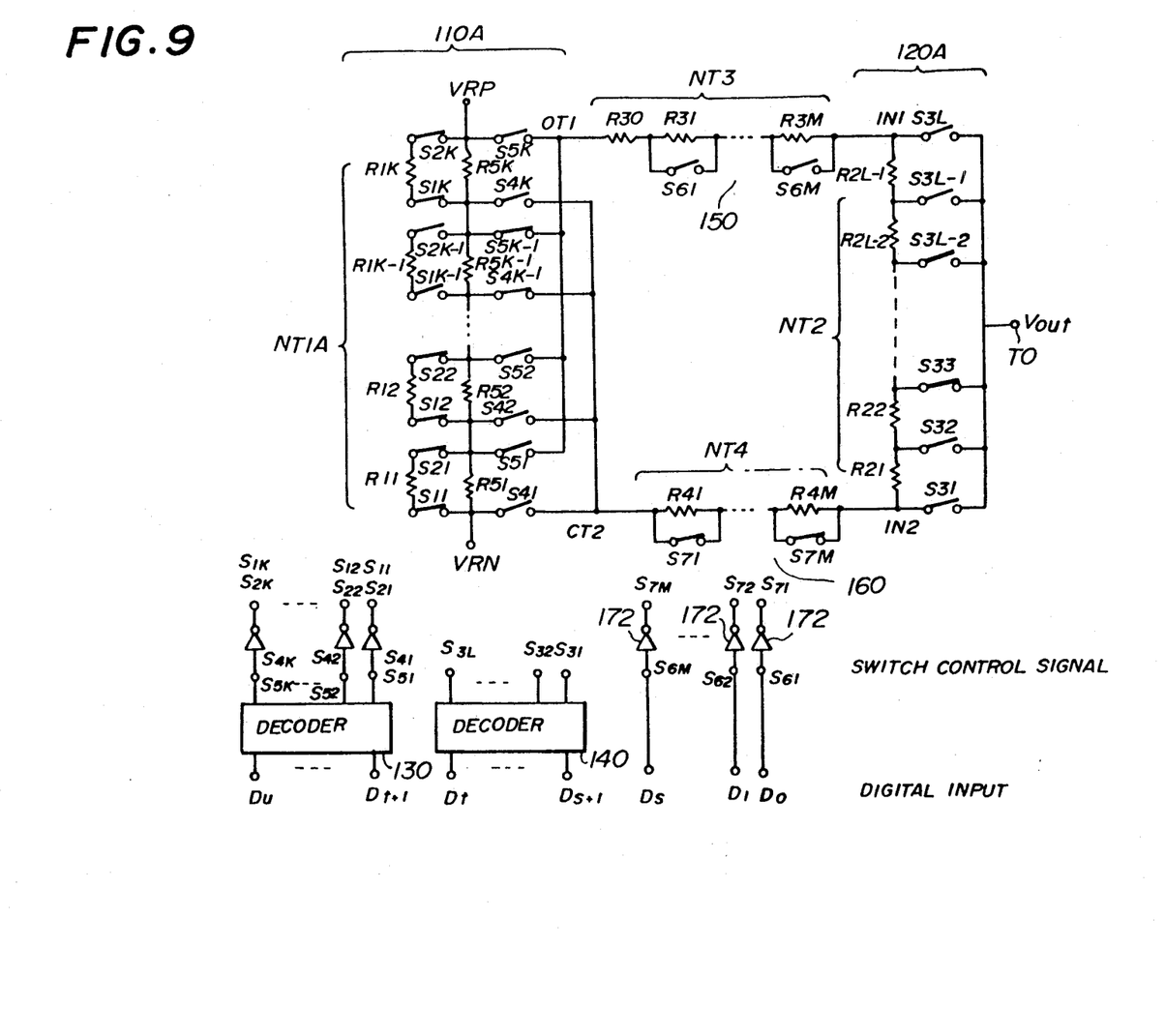
FIG. 9 is a circuit diagram of a fourth embodiment of the present invention.

FIG. 9 is a circuit diagram of a D/A converter according to a fourth embodiment of the present invention. In FIG. 9, parts which are the same as those shown in the previously described figures are given the same reference numerals. The D/A converter shown in FIG. 9 corresponds to a combination of the D/A converter shown in FIG. 4 and the D/A converter shown in FIG. 5. More specifically, the first resistor network NT1 shown in FIG. 4 is replaced with the resistor network NTLA shown in FIG. 5. Hence, the D/A converter shown in FIG. 9 has the same advantages as to the resistors R51-R5K as has been described previously.

Figure 10:
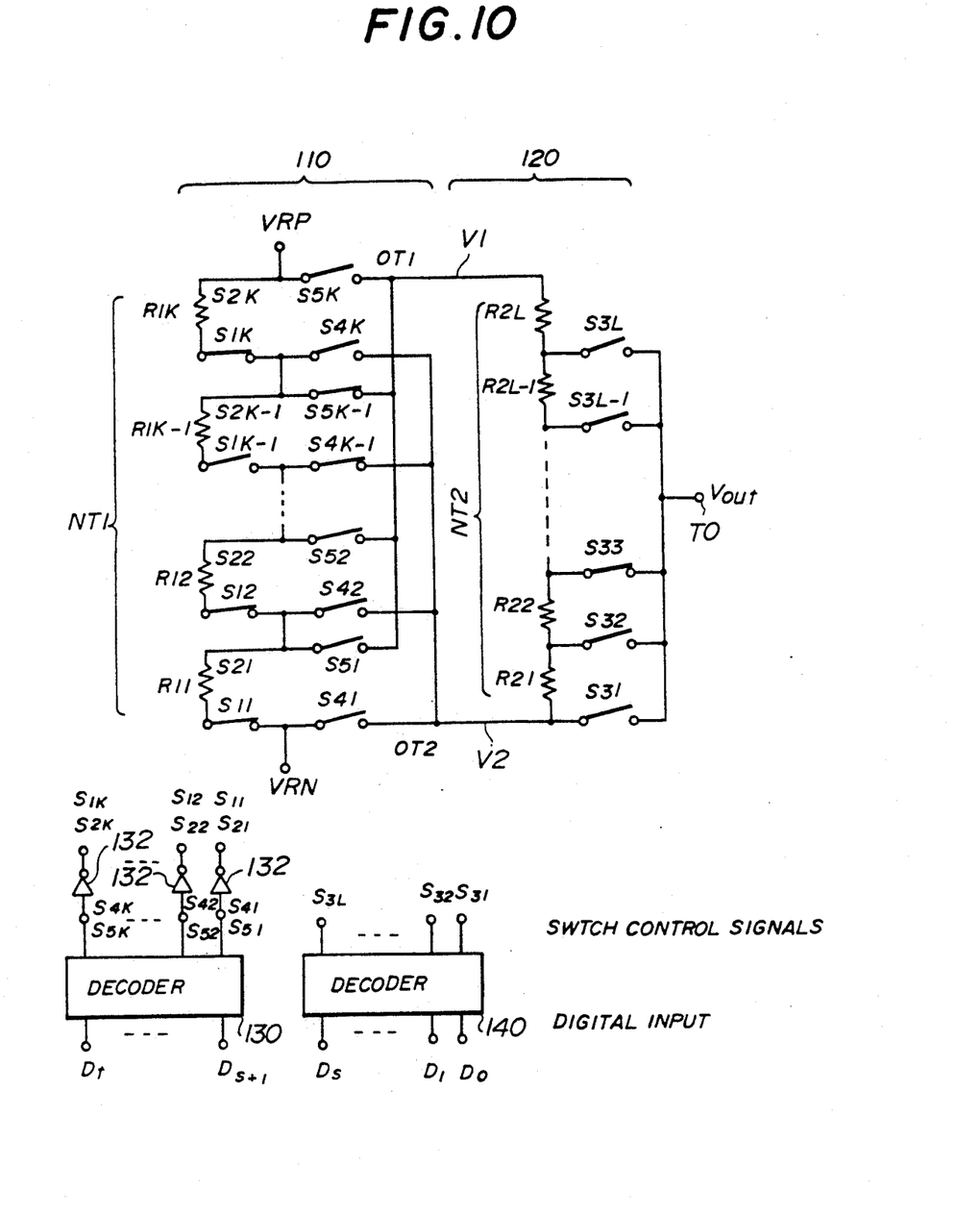
FIG. 10 is a circuit diagram of a variation of the D/A converter shown in FIG. 3.

In the embodiments of the present invention, it is possible to omit one of the two switches connected to ends of each of the resistors R11-R1K. Referring to FIG. 10, the switches S21-S2K are omitted from the D/A converter of the first embodiment of the present invention. In the same manner, variations of the second, third and fourth embodiments of the present invention can be made.

The switches used in the present invention are not limited to the configuration shown in FIG. 8. For example, a group of switches S41-S4K and a group of switches S51-S5K may be respectively formed with integrated switching units, such as multiplexers.

The present invention is not limited to the specifically disclosed embodiments, and variations and modifications may be made without departing from the scope of the present invention.

What is claimed is:

1. A D/A converter comprising:
    a first resistor network including K resistors each having a resistance, where K is an integer;
    a second resistor network including L resistors connected in series where L is an integer, a sum of resistances of the L resistors being approximately equal to the resistance of each of the K resistors;
    first switching means, coupled to the K resistors, for selecting (K−1) resistors among the K resistors in accordance with a digital input signal and for forming a series circuit including the (K−1) resistors and said second resistor network connected in series, first and second voltages being applied to respective ends of said series circuit; and
    second switching means, coupled to said second series circuit, for connecting one of the L resistors to an output terminal of the D/A converter.

2. A D/A converter as claimed in claim 1, wherein:
    one of the L resistors comprises a plurality of resistors which are connected in series and which form a third resistor network connected to the second resistor network in series, and
    wherein said D/A converter further comprises:
    a fourth resistor network including a plurality of resistors connected to the second resistor network in series; and
    third switching means, coupled to the resistors of the third resistor network and the resistors of the fourth resistor network, for selectively shortcircuiting the resistors of the third and fourth resistor networks in accordance with the digital input signal.

3. A D/A converter as claimed in claim 2, wherein the resistors of said third and fourth resistor network have resistances so that a sum of the resistances of the resistors of the third resistor network including resistors shortcircuited by said third switching means and the resistances of the resistors of the fourth resistor network including resistors shortcircuited by said third switching means is approximately equal to the resistance of each of the resistors of the second resistor network.

4. A D/A converter as claimed in claim 2, wherein:
    the resistances of the resistors of the third resistor network are smaller than those of the resistors of the second resistor network; and
    the resistances of the resistors of the fourth resistor network are smaller than those of the resistors of the second resistor network.

5. A D/A converter as claimed in claim 2, wherein said D/A converter comprises a fifth resistor network including K resistors connected in series so that the first and second voltages are respectively applied to respective ends of the fifth resistor network.

6. A D/A converter as claimed in claim 2, wherein:
    said D/A converter comprises decoder means for generating first, second and third control signals from high-order, middle-order and low-order bits of the digital input signal;
    the first switching means is controlled by the first control signal;
    the second switching means is controlled by one of the second and third control signals; and
    the third switching means is controlled by the other one of the second and third control signals.

7. A D/A converter as claimed in claim 1, wherein:
    one of the L resistors comprises (M+1) resistors which are connected in series and which form a third resistor network connected to the second resistor network in series where M is an integer, and
    wherein said D/A converter further comprises:
    a fourth resistor network including M resistors connected to the second resistor network in series; and
    third switching means, coupled to the resistors of the third resistor network and the resistors of the fourth resistor network, for selectively shortcircuiting the resistors of the third and fourth resistor networks in accordance with the digital input signal.

8. A D/A converter as claimed in claim 7, wherein said third switching means comprises means for selecting (M+1) resistors from among the (2M+1) resistors of the third and fourth resistor networks.

9. A D/A converter as claimed in claim 7, wherein:
    the M resistors of the fourth resistor network are paired with a corresponding resistor of the third resistor network; and
    said third switching means comprises means for shortcircuiting selected ones of the resistors of the third and fourth resistor networks in accordance with the digital input signal.

10. A D/A converter as claimed in claim 7, wherein said D/A converter comprises a fifth resistor network including K resistors connected in series so that the first and second voltages are respectively applied to respective ends of the fifth resistor network.

11. A D/A converter as claimed in claim 7, wherein:
    said D/A converter comprises decoder means for generating first, second and third control signals from high-order, middle-order and low-order bits of the digital input signal;
    the first switching means is controlled by the first control signal;
    the second switching means is controlled by one of the second and third control signals; and
    the third switching means is controlled by the other one of the second and third control signals.

12. A D/A converter as claimed in claim 7, wherein the first switching means comprises:

a first group of M switches respectively connected across the M resistors among the (M+1) resistors of the third resistor network; and a second group of M switches respectively connected across the M resistors of the fourth resistor network, and wherein:

the M switches of the first group are controlled by M bits of the digital input signal; and the M switches of the second group are controlled by an inverted version of the M bits of the digital input signal.

13. A D/A converter as claimed in claim 7, wherein the K, L and M satisfy the following condition:

$$K \cdot L \cdot M = 2^n$$

where n is a number of bits of the digital input signal.

14. A D/A converter as claimed in claim 1, wherein said D/A converter comprises a third resistor network including K resistors connected in series so that the first and second voltages are respectively applied to respective ends of the third resistor network.

15. A D/A converter as claimed in claim 1, wherein:

said D/A converter comprises decoder means for generating a first control signal from high-order bits of the digital input signal and for generating a second control signal from low-order bits thereof; and the first switching means is controlled by the first control signal, and the second switching means is controlled by the second control signal.

16. A D/A converter as claimed in claim 1, wherein the K and L satisfy the following condition:

$$K \cdot L = 2^n$$

where n is a number of bits of the digital input signal.

* * * * *